United States Patent
Khanna et al.

(10) Patent No.: US 7,796,079 B2
(45) Date of Patent: Sep. 14, 2010

(54) CHARGE REDISTRIBUTION SUCCESSIVE APPROXIMATION ANALOG-TO-DIGITAL CONVERTER AND RELATED OPERATING METHOD

(75) Inventors: Ashish Khanna, Maricopa, AZ (US); Sung Jin Jo, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 65 days.

(21) Appl. No.: 12/360,933

(22) Filed: Jan. 28, 2009

(65) Prior Publication Data

US 2010/0188278 A1  Jul. 29, 2010

(51) Int. Cl.
*H03M 1/12* (2006.01)
(52) U.S. Cl. ..................... 341/172; 341/163
(58) Field of Classification Search ............. 341/161, 341/162, 163, 172
See application file for complete search history.

(56) References Cited

U.S. PATENT DOCUMENTS

| | | | |
|---|---|---|---|
| 4,195,282 A * | 3/1980 | Cameron | 341/172 |
| 4,803,462 A * | 2/1989 | Hester et al. | 341/172 |
| 5,889,486 A | 3/1999 | Opris et al. | |
| 6,522,277 B2 | 2/2003 | Fujimori et al. | |
| 7,015,852 B1 | 3/2006 | Atris et al. | |
| 7,023,372 B1 * | 4/2006 | Singh et al. | 341/155 |
| 7,235,983 B2 | 6/2007 | O'Dowd et al. | |
| 7,265,706 B2 | 9/2007 | Boemler | |
| 7,271,758 B2 | 9/2007 | Piasecki et al. | |
| 7,282,929 B2 | 10/2007 | Atris et al. | |
| 7,289,502 B1 | 10/2007 | Gemelli et al. | |
| 7,304,483 B2 | 12/2007 | O'Dowd et al. | |
| 7,411,538 B1 | 8/2008 | Piasecki | |
| 2003/0234736 A1 * | 12/2003 | Tachibana et al. | 341/172 |
| 2005/0140537 A1 * | 6/2005 | Waltari | 341/162 |
| 2006/0068749 A1 | 3/2006 | Ismail et al. | |
| 2008/0211706 A1 | 9/2008 | Sutardja | |
| 2010/0001892 A1 * | 1/2010 | Aruga et al. | 341/172 |

OTHER PUBLICATIONS

Lotters, J., et al., A sensitive differential capacitance to voltage converter for sensor applications, Instrumentation and Measurement, IEEE Transactions on vol. 48, Issue 1, Feb. 1999, pp. 89-96.

(Continued)

*Primary Examiner*—Howard Williams
(74) *Attorney, Agent, or Firm*—Ingrassia, Fisher & Lorenz, P.C.

(57) ABSTRACT

The analog-to-digital converter provided herein includes a capacitor bank comprising a plurality of binary-weighted capacitors, an operational amplifier having an inverting input node, a noninverting input node coupled to analog ground, and an output node, a reset switch, and an input switch. The reset switch is located between the capacitor bank and the operational amplifier, and it selectively couples the capacitor bank to the inverting input node. The input switch has its common terminal coupled to the capacitor bank, and the input switch selectively couples the capacitor bank to either an analog input voltage, a floating terminal, or analog ground. The capacitor bank includes N binary-weighted capacitors and one balancing capacitor that has a unit capacitance. During operation, the analog-to-digital converter generates an N-bit digital output and one polarity bit from the analog input voltage.

20 Claims, 11 Drawing Sheets

OTHER PUBLICATIONS

Craninckx, J., et al., A 65fJ/Conversion-Step 0-to-50MS/s 0-to-0.7mW 9b Charge-Sharing SAR ADC in 90nm Digital CMOS, ISSCC 2007, Session 13, Feb. 2007, pp. 246-247; 600.

Agnes, A, et al., A 9.4ENOB 1V 3.8 uW 100sK/s SAR ADC with time domain comparator, IEEE International Solid State Circuits Conference, pp. 246-247, 2008.

* cited by examiner

CHARGE REDISTRIBUTION SUCCESSIVE APPROXIMATION ANALOG-TO-DIGITAL CONVERTER AND RELATED OPERATING METHOD

RELATED APPLICATIONS

The subject matter described here is related to that described in U.S. patent application Ser. No. 12/360,932, and to that described in U.S. patent application Ser. No. 12/360,934. The entire content of these related applications is incorporated by reference herein.

TECHNICAL FIELD

Embodiments of the subject matter described herein relate generally to analog-to-digital converter (ADC) circuits. More particularly, embodiments of the subject matter relate to ADC circuits that utilize charge redistribution successive approximation registers.

BACKGROUND

The prior art is replete with ADC circuits that utilize successive approximation registers (SARs). A charge redistribution SAR ADC includes a bank of binary-weighted capacitors that sample the analog voltage input and are thereafter switched in an appropriate manner to determine the bit-by-bit digital output corresponding to the sampled analog voltage input. One known topology for a charge redistribution SAR ADC is shown in FIG. 1. The illustrated ADC circuit 100 includes seven capacitors that are used to generate a five-bit digital output, along with one polarity bit. This implementation also includes a devoted comparator, which is realized using an operational amplifier circuit 102.

Notably, ADC circuit 100 includes a capacitor 104 that is utilized for purposes of polarity determination. The capacitance of capacitor 104 is the highest in the bank of capacitors. In addition, ADC circuit 100 requires at least four switches per bit. In other words, four different switches are used for the voltage comparison operation associated with each bit. Although ADC circuit 100 functions in an appropriate and adequate manner, the use of capacitor 104 and four switches per bit requires physical space that could otherwise be devoted to other circuits and/or be saved to reduce the package size of the host device. Moreover, since the switches in ADC circuit 100 are typically realized with transistors, the power requirement of ADC circuit 100 increases with each switch. Accordingly, ADC circuit 100 may not be the best choice for low power applications and/or for mobile device applications that rely on batteries for operating power.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode).

The following description may refer to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically. Thus, although the schematics shown in the figures depict exemplary arrangements of elements, additional intervening elements, devices, features, or components may be present in an embodiment of the depicted subject matter.

The exemplary embodiments described herein relate to a charge redistribution SAR ADC circuit, which can be deployed in a wide variety of applications where it is desirable to convert an analog voltage into a digital representation. In such applications, the analog voltage is ordinarily within a certain range, and the digital output is generated using a predetermined number of bits. For example, certain practical embodiments of the subject matter described here contemplate an analog voltage input in the range of 0.0 to 2.2 volts, and the analog voltage input is converted into a digital representation having four to eight bits. Of course, the actual analog voltage range and the number of output bits may vary to suit the needs of the particular application.

Figure 1:
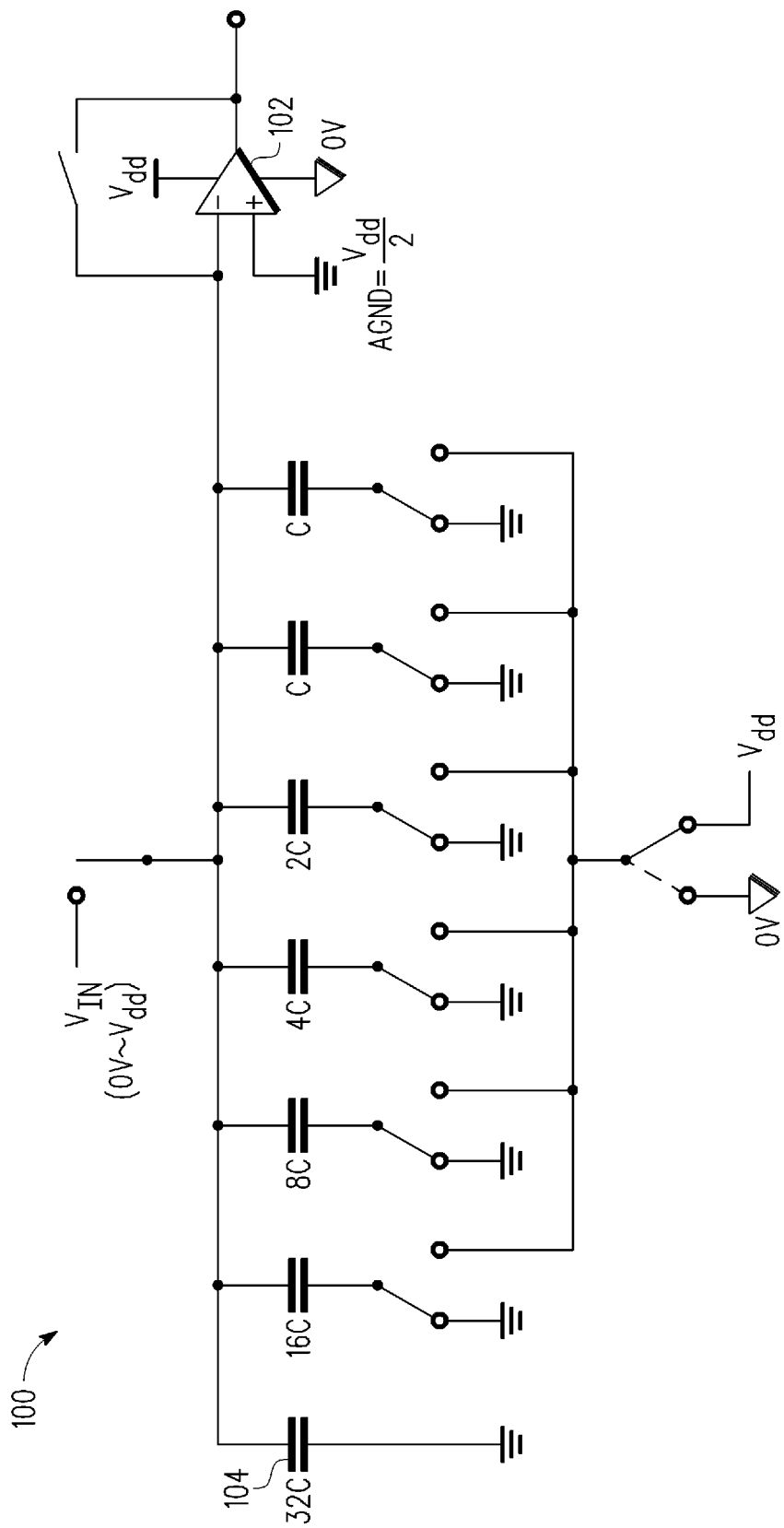
FIG. 1 is a circuit diagram of a prior art charge redistribution SAR ADC circuit.
Figure 2:
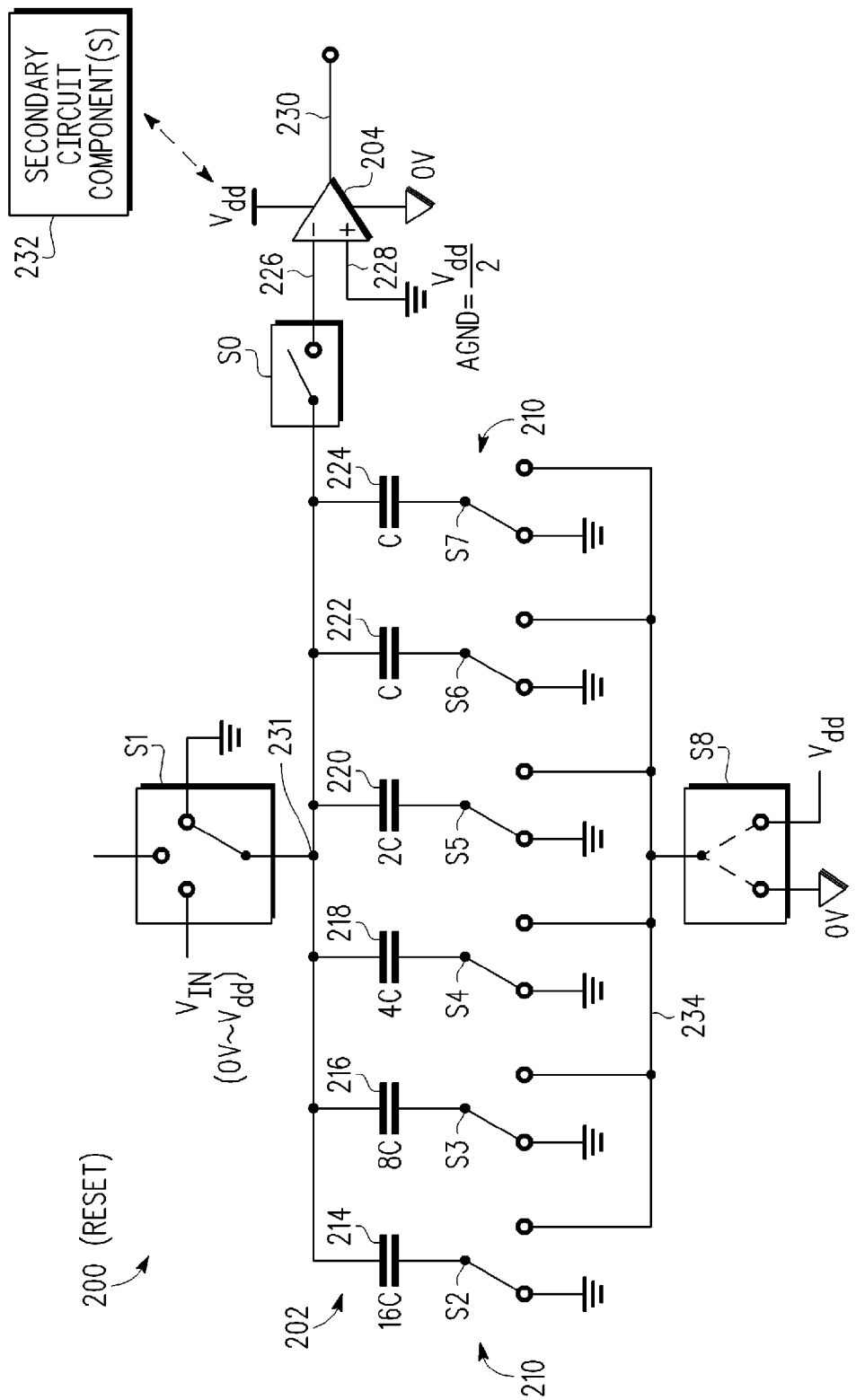
FIG. 2 is a circuit diagram of an exemplary embodiment of a charge redistribution SAR ADC circuit, arranged for operation in a reset mode.

FIG. 2 is a circuit diagram of an exemplary embodiment of a charge redistribution SAR ADC circuit 200, arranged for operation in a reset mode. This embodiment of ADC circuit 200 generally includes, without limitation: a capacitor bank 202; an operational amplifier 204 arranged in a comparator configuration; an input switch S1; a reference switch S8; a plurality of capacitor switches 210 (individually labeled S2-S7) for capacitor bank 202; and a reset switch S0. Although not depicted in the figures, ADC circuit 200 will include suitable switch control logic (which may be implemented or performed by an appropriate processor element) that determines and sets the desired state of input switch S1, reference switch S8, capacitor switches 210, and reset switch S0. The various elements and components of ADC circuit 200 are coupled together as needed to support the different operating modes described in more detail below. For the sake of brevity, conventional techniques related to analog-to-digital conversion, SAR, switch control, and other functional aspects of the circuits (and the individual operating components of the circuits) may not be described in detail herein.

Capacitor bank 202 includes a plurality of binary-weighted capacitors (reference numbers 214, 216, 218, 220, 222, 224). As used here, "binary-weighted" means that the capacitance values are weighted in a binary manner relative to a unit capacitance (C). In other words, the capacitance of each binary-weighted capacitor is equal to $2^X \times C$, where X is zero or any non-negative integer and where C is the unit capacitance. In preferred embodiments, ADC circuit 200 generates an N-bit digital output and a single polarity bit from the analog input voltage, and capacitor bank 202 consists of N binary-weighted capacitors and one balancing capacitor. This configuration employs at least one fewer capacitor than certain conventional ADC architectures, which require an additional capacitor for purposes of polarity determination. The illustrated embodiment includes six capacitors, which correspond to a five-bit digital output (capacitor 224 represents a balancing capacitor). Each of these capacitors has one of its conductors (the top conductor shown in FIG. 2) coupled to the common terminal of input switch S1. This shared node is referred to herein as the capacitor input node 231. The other conductor (the bottom conductor shown in FIG. 2) is coupled to one of the plurality of capacitor switches 210. In particular, capacitor 214 is coupled between input switch S1 and capacitor switch S2, capacitor 216 is coupled between input switch S1 and capacitor switch S3, capacitor 218 is coupled between input switch S1 and capacitor switch S4, capacitor 220 is coupled between input switch S1 and capacitor switch S5, capacitor 222 is coupled between input switch S1 and capacitor switch S6, and capacitor 224 is coupled between input switch S1 and capacitor switch S7.

The capacitance of each capacitor in the capacitor bank 202 is based upon a unit capacitance (C) for ADC circuit 200. As depicted in FIG. 2, capacitor 222 has the unit capacitance, as does capacitor 224. The capacitance of capacitor 220 is two times the unit capacitance, the capacitance of capacitor 218 is four times the unit capacitance, the capacitance of capacitor 216 is eight times the unit capacitance, and the capacitance of capacitor 214 is sixteen times the unit capacitance. The value of C will depend on the mismatch characteristics and the desired resolution specification. Of course, the actual value of C may also depend upon the analog voltage levels, the number of output bits, the particular application, and other practical considerations and factors. In one implementation, the value of C is 250 fF.

The implementation of operational amplifier 204 depicted in FIG. 2 is connected to an upper reference voltage, e.g., a supply voltage (Vdd), and to a lower reference voltage, e.g., ground (zero volts); Vdd also has significance during analog-to-digital conversion, as explained below. Operational amplifier 204 has an inverting input node 226, a noninverting input node 228, and an output node 230. As depicted in FIG. 2, noninverting input node 228 is connected to analog ground potential (labeled AGND, and identified by the analog ground symbol throughout the figures), via an analog ground node. Notably, AGND need not be equal to zero volts. Indeed, for this particular embodiment, $$AGND = \frac{Vdd}{2}.$$

Inverting input node 226 of operational amplifier 204 is selectively coupled to capacitor bank 202 via reset switch S0, which is located between capacitor bank 202 and operational amplifier 204. In other words, when reset switch S0 is open (as depicted in FIG. 2), operational amplifier 204 is effectively removed from the remainder of ADC circuit 200. Notably, when operational amplifier 204 is disconnected from ADC circuit 200 in this manner it can be utilized for other purposes as a component in other circuits of the host device. For example, operational amplifier 204 could be used as a voltage follower, a gain element, an inverter, a comparator, or the like, as desired. In this regard, one or more secondary circuit components 232 could be associated with operational amplifier 204, where such secondary circuit components 232 can be coupled to operational amplifier 204 when reset switch S0 is in an open state that removes, isolates, or disconnects operational amplifier 204 from capacitor bank 202. The dashed arrow in FIG. 2 represents this temporary coupling and "reuse" capability of operational amplifier 204. Conversely, when reset switch S0 is closed (see, e.g., FIG. 5), inverting input node 226 of operational amplifier 204 is coupled to capacitor bank 202 to function as a voltage comparator during analog-to-digital conversion. In this regard, when reset switch S0 is closed, the voltage at output node 230 of operational amplifier 204 represents a logic high (a "1" bit) or a logic low (a "0" bit) value. When reset switch S0 is in the closed state, secondary circuit components 232 are disconnected from operational amplifier 204 so that they do not influence the ADC operation.

Input switch S1 may be realized as a single pole triple throw switch having its common terminal coupled to capacitor bank 202, as shown in FIG. 2. A first selectable terminal of input switch S1 is coupled to the analog voltage input ($V_{IN}$), a second selectable terminal is coupled to the analog ground node, and the third selectable terminal is left floating (i.e., it corresponds to an open circuit condition). This allows input switch S1 to selectively couple capacitor bank 202 to either $V_{IN}$, the floating terminal, or analog ground as needed. $V_{IN}$ is the analog voltage that is converted into digital form by ADC circuit 200 in the manner described in detail below. For this example, $V_{IN}$ has a voltage range between zero volts and Vdd. Moreover, AGND is defined as the midpoint of this voltage range, i.e., $$AGND = \frac{Vdd}{2}.$$

Therefore, in an alternate embodiment where $V_{IN}$ has a voltage range of negative $$\frac{Vdd}{2}$$

to positive $$\frac{Vdd}{2},$$

AGND is defined to be zero volts.

Reference switch S8 may be realized as a single pole double throw switch having its common terminal coupled to each of the capacitor switches 210. This common terminal represents a capacitor reference node 234 for ADC circuit 200. More particularly, each of the capacitor switches 210 has one of its selectable terminals coupled to the common terminal of reference switch S8, as depicted in FIG. 2. The first selectable terminal of reference switch S8 is coupled to a lower reference voltage such as ground (zero volts), and the second selectable terminal of reference switch S8 is coupled to an upper reference voltage such as Vdd.

Each capacitor switch 210 may be realized as a single pole double throw switch having its common terminal coupled to the bottom conductor of its respective capacitor. In the illustrated embodiment, switch S2 is connected to the bottom conductor of capacitor 214, switch S3 is connected to the bottom conductor of capacitor 216, switch S4 is connected to the bottom conductor of capacitor 218, switch S5 is connected to the bottom conductor of capacitor 220, switch S6 is connected to the bottom conductor of capacitor 222, and switch S7 is connected to the bottom conductor of capacitor 224. One selectable terminal of each capacitor switch 210 is coupled to the analog ground node, while the other selectable terminal of each capacitor switch 210 is coupled to the common terminal of reference switch S8, as mentioned previously.

Figure 3:
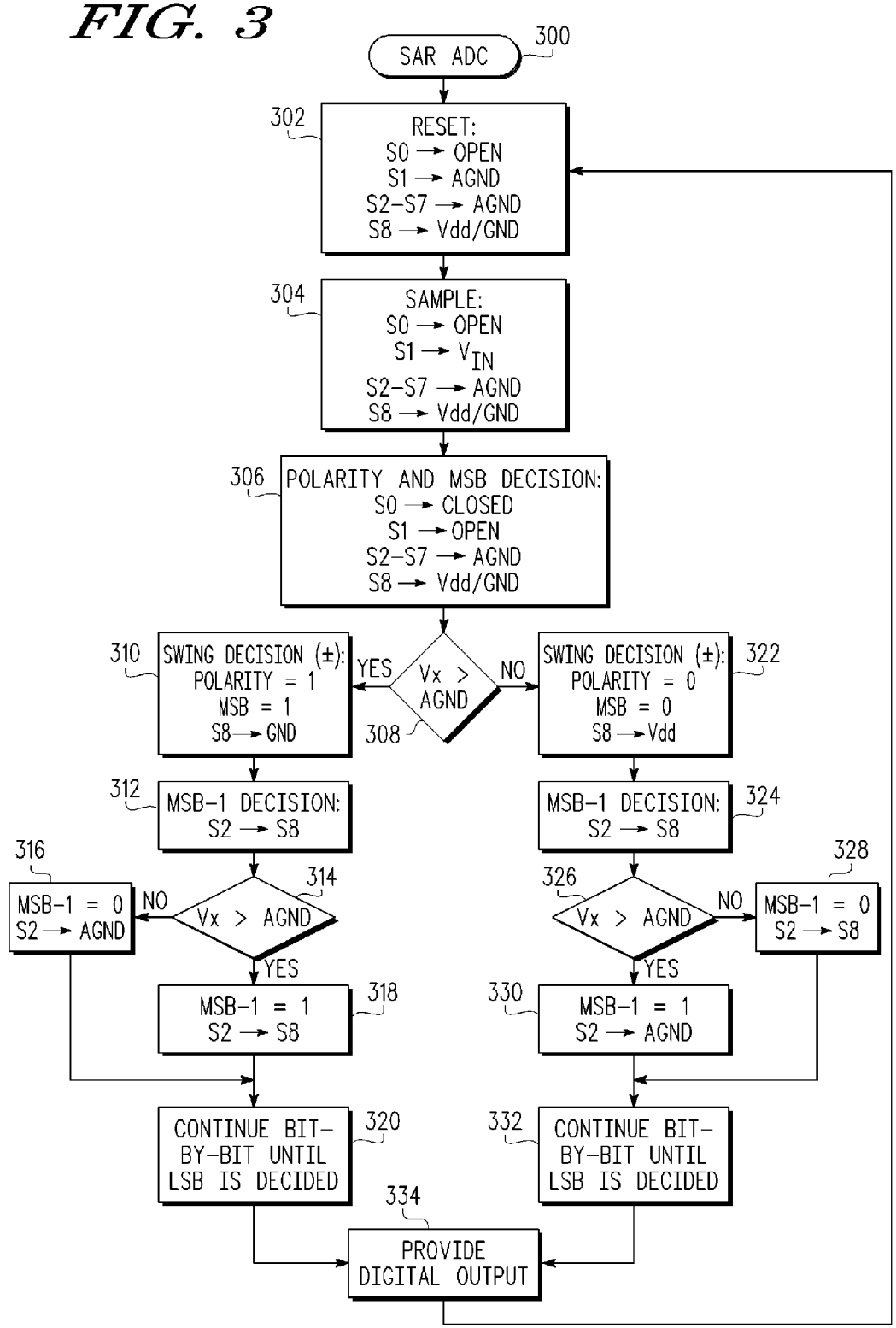
FIG. 3 is a flow chart that illustrates an exemplary embodiment of an SAR ADC process, which may be carried out by the SAR ADC circuit depicted in FIG. 2.

Input switch S1, reference switch S8, each capacitor switch 210, and reset switch S0 are independently actuated under the control of suitable switching logic (not shown). The topology of ADC circuit 200 at any given moment will therefore change depending upon the states of these switches. As described in more detail below, these switches are suitably controlled and arranged as needed to accommodate operation of ADC circuit 200 in various modes during analog-to-digital conversion of $V_{IN}$. In this regard, FIG. 3 is a flow chart that illustrates an exemplary embodiment of an SAR ADC process 300, which may be carried out by ADC circuit 200. The various tasks performed in connection with process 300 may be performed by software, hardware, firmware, or any combination thereof. For illustrative purposes, the following description of process 300 may refer to ADC circuit 200 or elements thereof. In practice, portions of process 300 may be performed by different elements of ADC circuit 200, e.g., one or more switches, the operational amplifier, or the like. It should be appreciated that process 300 may include any number of additional or alternative tasks, the tasks shown in FIG. 3 need not be performed in the illustrated order, and process 300 may be incorporated into a more comprehensive procedure or process having additional functionality not described in detail herein.

Process 300 is performed whenever an analog input voltage needs to be converted into a digital representation. In certain embodiments, process 300 can be iteratively performed in a substantially continuous manner or as often as needed. The illustrated embodiment of process 300 begins by resetting ADC circuit 200 (task 302). Resetting is performed to remove the charge across capacitor bank 202 or to otherwise initialize the voltage across capacitor bank 202. In this regard, FIG. 2 depicts ADC circuit 200 as arranged for operation in the reset mode. For this reset topology, input switch S1 is set such that it connects AGND to its common terminal, all of the capacitor switches 210 (i.e., S2-S7) are set such that each one connects AGND to its respective common terminal, reference switch S8 can be set to any arbitrary position (because its common terminal is left floating), and reset switch S0 is opened to disconnect and isolate operational amplifier 204 from the remainder of ADC circuit 200. In this arrangement, AGND is connected across each capacitor in the capacitor bank 202, thus removing any charge from those capacitors. In other words, each capacitor in the capacitor bank 202 is reset or "zeroed" to prepare ADC circuit 200 for voltage sampling.

ADC circuit 200 preferably remains in the reset mode for a sufficient amount of time to allow capacitor bank 202 to be reset/initialized. In other words, while the reset configuration is enabled, the capacitors in the capacitor bank 202 are zeroed. In certain embodiments, secondary circuit components 232 can be coupled to operational amplifier 204 after reset switch 212 has isolated operational amplifier 204 from capacitor bank 202. This allows secondary circuit components 232 to be operated in conjunction with operational amplifier 204 while operational amplifier 204 is isolated. Thereafter, process 300 continues by arranging the elements of ADC circuit 200 into a voltage sampling topology. This allows ADC circuit 200 to sample the analog input voltage, $V_{IN}$ (task 304). In this regard, FIG. 4 is a circuit diagram of ADC circuit 200, arranged for operation in the sample mode.

The state of input switch S1 changes to achieve the sampling topology; the other switches in ADC circuit 200 remain in their previous states. More specifically, input switch S1 is set such that it connects $V_{IN}$ to its common terminal (this action also corresponds to the removal of AGND from its common terminal). Since reset switch S0 remains open at this time, $V_{IN}$ is applied to the common conductors of the capacitors in the capacitor bank 202. In other words, each capacitor in the capacitor bank 202 is subjected to a charging potential equal to $V_{IN}$–AGND, which equals $$V_{IN} - \frac{Vdd}{2}.$$

Figure 4:
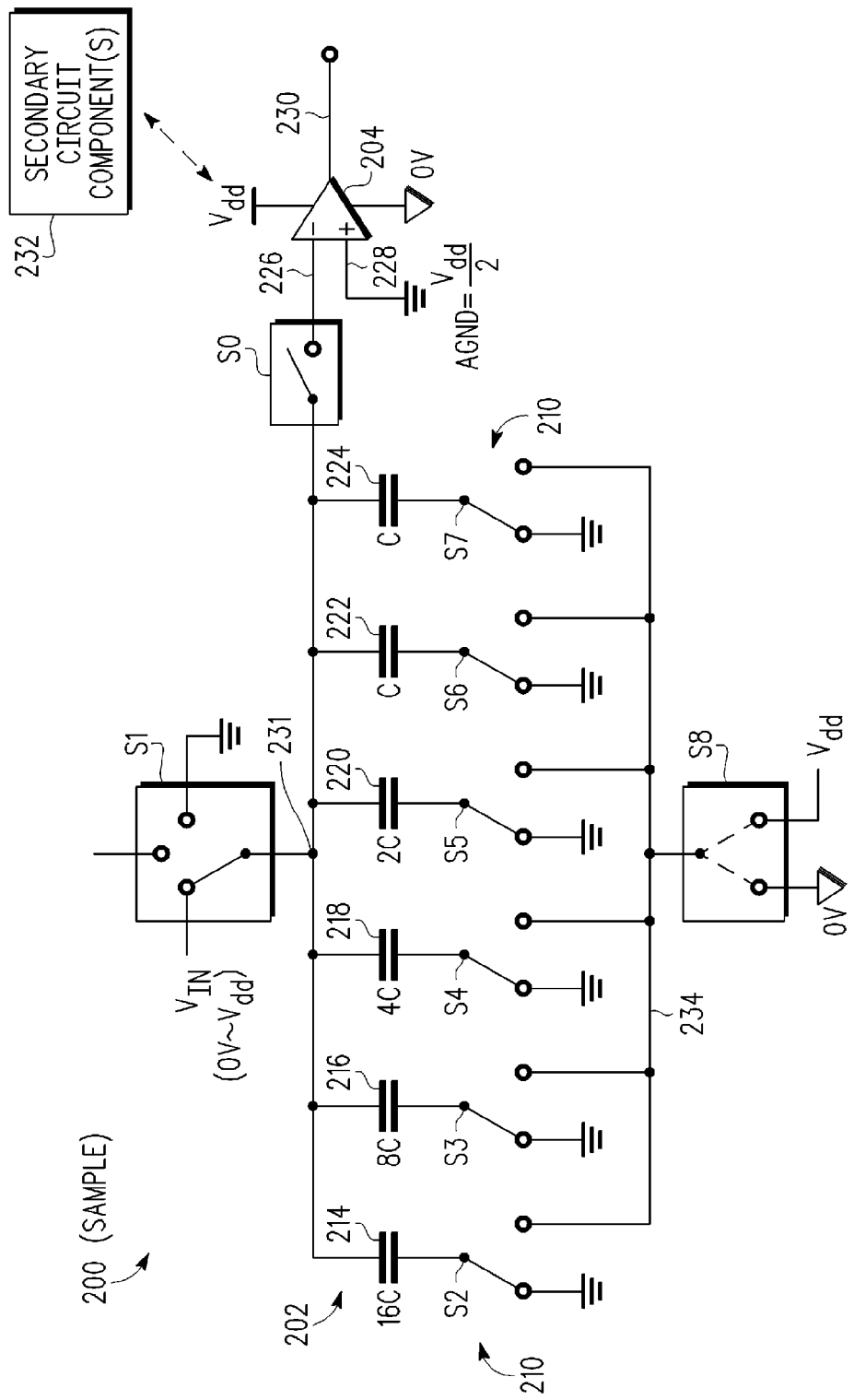
FIG. 4 is a circuit diagram of the ADC circuit, arranged for operation in a sample mode.

As depicted in FIG. 4, this charging potential appears across each capacitor in capacitor bank 202.

ADC circuit 200 preferably remains in the sampling mode for a sufficient amount of time to allow $V_{IN}$ to be sampled (i.e., capacitor bank 202 is charged). Notably, since reset switch 212 remains open during input voltage sampling, secondary circuit components 232 can remain coupled to operational amplifier 204 while ADC circuit 200 is in the sample topology. Thereafter, process 300 continues by arranging the elements of ADC circuit 200 into a polarity decision topology. This allows ADC circuit 200 to determine the polarity of the input voltage (task 306). If the input voltage range is zero to Vdd, then a polarity bit of "1" indicates that the input is greater than $$\frac{Vdd}{2},$$

and a polarity bit of "0" indicates that the input is less than $$\frac{Vdd}{2}.$$

If the input voltage range is $$-\frac{Vdd}{2} \text{ to } +\frac{Vdd}{2},$$

then a polarity bit of "1" indicates that the input is greater than zero, and a polarity bit of "0" indicates that the input is less than zero. Notably, at this time ADC circuit 200 also performs the most significant bit (MSB) decision for $V_{IN}$.

Figure 5:
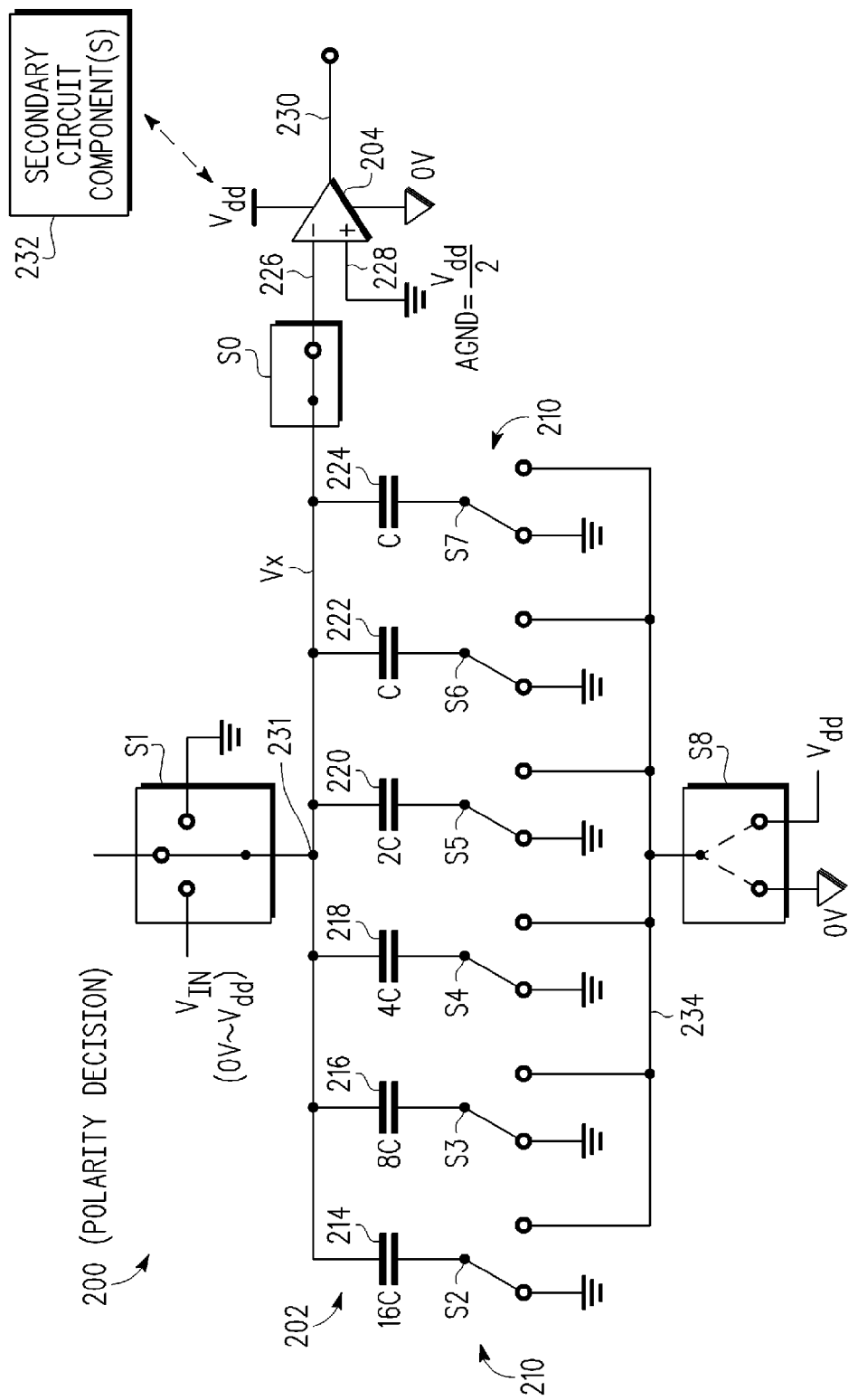
FIG. 5 is a circuit diagram of the ADC circuit, arranged for operation in a polarity determination mode.

FIG. 5 is a circuit diagram of ADC circuit 200, arranged for operation in the polarity determination mode. To achieve the polarity decision topology depicted in FIG. 5, ADC circuit 200 is rearranged by changing the states of input switch S1 and reset switch S0, while maintaining the other switches in ADC circuit 200 in their previous states. More specifically, input switch S1 is opened such that its common terminal is left floating (i.e., it is neither connected to $V_{IN}$ nor to AGND). Moreover, reset switch S0 is closed such that inverting input node 226 of operational amplifier 204 is now connected to the common conductor of capacitor bank 202. Notably, operational amplifier 204 now functions as a comparator with respect to the voltage present at inverting input node 226 (Vx) and the voltage present at noninverting input node 228 (AGND). Consequently, at this time, operational amplifier 204 is no longer being shared with other circuits, functional modules, or processes of the host device. Thus, before coupling operational amplifier 204 to capacitor bank 202 for purposes of polarity/MSB decision, secondary circuit components 232 may need to be disconnected from operational amplifier 204.

When the polarity determination mode begins, $Vx \approx V_{IN}$. At this time, operational amplifier 204 compares Vx to AGND, which is equal to $$\frac{Vdd}{2}$$

for this example (query task 308). If Vx>AGND, then operational amplifier 204 will generate a relatively low voltage at output node 230 (this relatively low output voltage corresponds to a logic low value). In the context of process 300, this logic low value represents a polarity bit of "1" and an MSB bit of "1" (task 310). On the other hand, if Vx<AGND, then operational amplifier 204 will generate a relatively high voltage at output node 230 (this relatively high output voltage corresponds to a logic high value). In the context of process 300, this logic high value represents a polarity bit of "0" and an MSB bit of "0" (task 322). These bit values are recorded, saved, or output in an appropriate manner.

Figure 6:
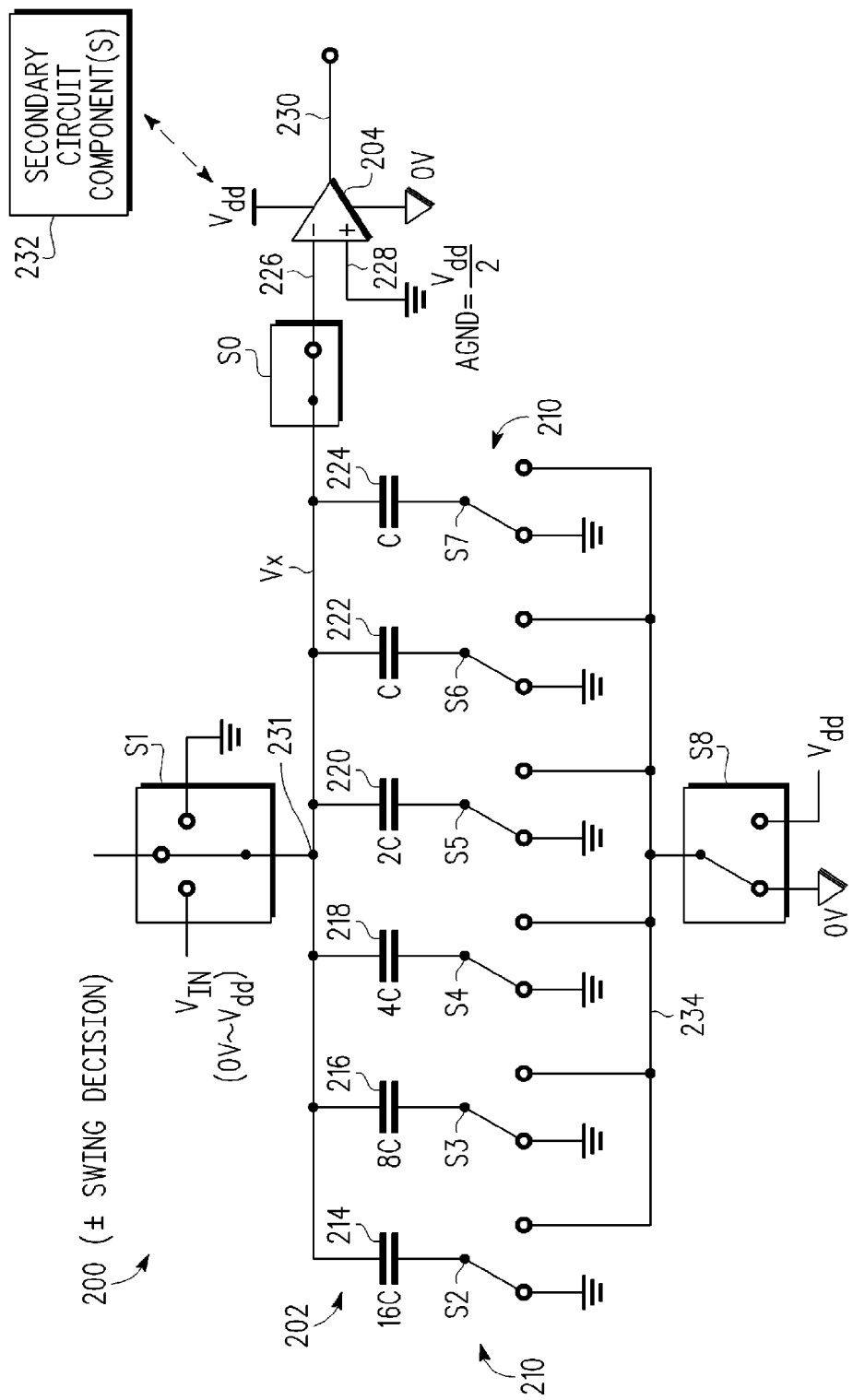
FIG. 6 is a circuit diagram of the ADC circuit, arranged in accordance with a plus/minus swing decision mode.

ADC circuit 200 preferably remains in the polarity and MSB decision mode for a sufficient amount of time to allow the polarity and MSB values to be determined. The following portion of this description assumes that Vx>AGND, and that task 310 is performed (rather than task 322). For those conditions, the polarity bit is "1" and ADC circuit 200 will be rearranged in accordance with an appropriate plus/minus swing decision, as shown in FIG. 6. To achieve the topology depicted in FIG. 6, ADC circuit 200 is rearranged by changing the state of reference switch S8, while maintaining the other switches in ADC circuit 200 in their previous states. More specifically, reference switch S8 is set such that its common terminal is connected to ground (zero volts). This switching is necessary to prepare ADC circuit 200 for the decision associated with the next bit, i.e., the MSB-1 bit. Notably, since the polarity bit is "1" for this example, reference switch S8 remains connected to ground until the least significant bit (LSB) is decided.

Figure 7:
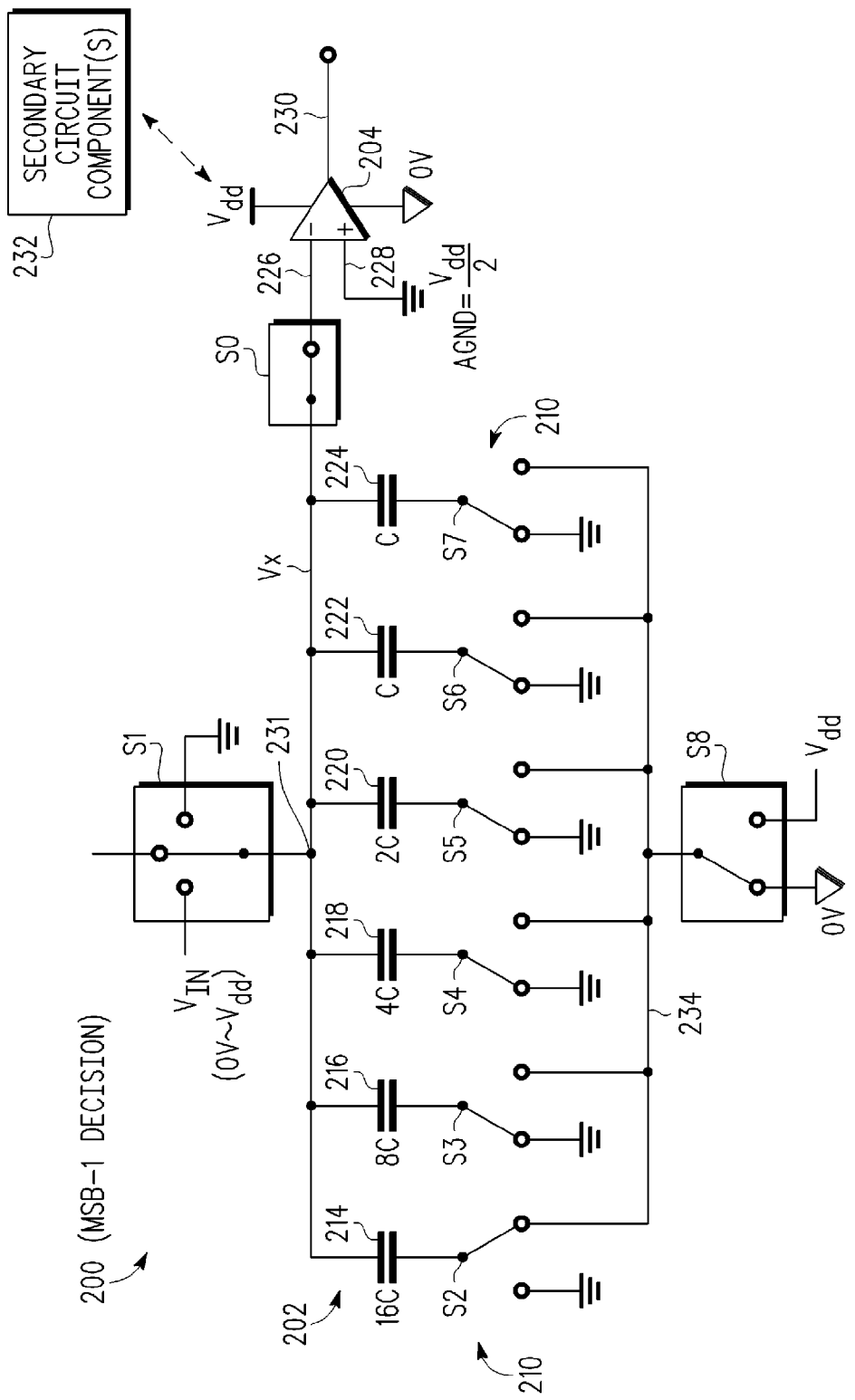
FIG. 7 is a circuit diagram of the ADC circuit, arranged in accordance with an MSB-1 decision mode.

Next, process 300 continues by performing the MSB-1 bit decision (task 312). In this regard, FIG. 7 is a circuit diagram of ADC circuit 200, arranged for operation in the MSB-1 decision mode. To achieve the MSB-1 decision topology depicted in FIG. 7, ADC circuit 200 is rearranged by changing the state of capacitor switch S2, while maintaining the other switches in ADC circuit 200 in their previous states. In particular, capacitor switch S2 is set such that its common terminal is coupled to the common terminal of reference switch S8. In other words, for the state depicted in FIG. 7, zero volts is applied to the common terminal of capacitor switch S2 (and, therefore, to the bottom conductor of capacitor 214). Notably, the switching of capacitor switch S2 results in a change in Vx (the voltage at inverting input node 226 is no longer equal to $V_{IN}$). In particular, the new value of Vx will be $$Vx = V_{IN} - \left(\frac{Vdd}{2} \times \frac{16}{32}\right).$$

The numerator in the fraction $$\frac{16}{32}$$

represents the capacitance of capacitor 214, which is sixteen times the unit capacitance, and the denominator in the fraction $$\frac{16}{32}$$

represents the total capacitance of capacitor bank 202, which equals thirty-two times the unit capacitance. The updated value of Vx represents the residual voltage that remains for analog-to-digital conversion.

While ADC circuit 200 is arranged as shown in FIG. 7, process 300 performs the MSB-1 decision by comparing the new value of Vx to AGND (query task 314). If at this time Vx≦AGND, then operational amplifier 204 will generate a relatively low voltage (i.e., a logic low value) at output node 230, and this output corresponds to an MSB-1 bit of "0" (task 316). Conversely, if Vx>AGND at this time, then operational amplifier 204 will generate a relatively high voltage (i.e., a logic high value) at output node 230, and this output corresponds to an MSB-1 bit of "1" (task 318). The determined bit value for MSB-1 can be recorded, saved, or output in an appropriate manner.

Figure 8:
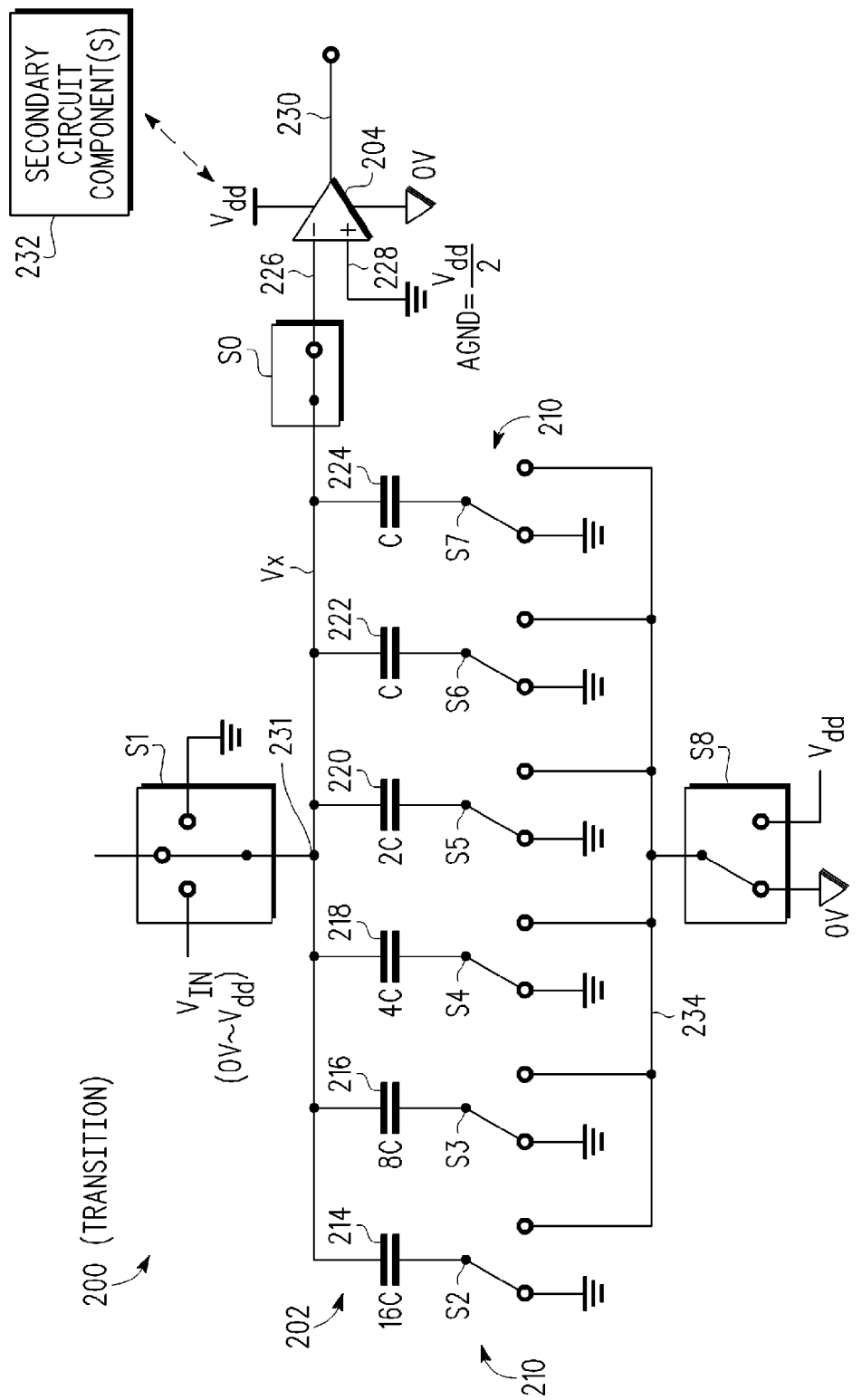
FIG. 8 is a circuit diagram of the ADC circuit, arranged in a transitional topology that follows a determination that the MSB-1 bit is a "0"

ADC circuit 200 preferably remains in the MSB-1 decision mode for a sufficient amount of time to accommodate the determination of the MSB-1 bit. The value of the MSB-1 bit influences the manner in which ADC circuit 200 is rearranged for subsequent operation. For example, if the MSB-1 bit is "0" at this time, then ADC circuit 200 is rearranged into the topology depicted in FIG. 8. The configuration shown in FIG. 8 is achieved by changing the state of capacitor switch S2 such that its common terminal is removed from the common terminal of reference switch S8 (i.e., removed from zero volts) and is instead connected to AGND, as indicated by task 316 in FIG. 3. The other switches of ADC circuit 200 are maintained in their previous states. If, however, the MSB-1 bit is "1" at this time, then ADC circuit 200 remains in the state depicted in FIG. 7. In other words, the common terminal of capacitor switch S2 remains connected to reference switch S8 and, therefore, capacitor 214 remains coupled between inverting input node 226 and zero volts (as indicated by task 318 in FIG. 3).

After the completion of task 316 or task 318 (whatever the case may be), process 300 continues in a bit-by-bit manner until the least significant bit (LSB) is decided (task 320). For example, the MSB-2 bit will be decided by changing capacitor switch S3 such that its common terminal is connected to the common terminal of reference switch S8 and, therefore, to zero volts (while leaving the other switches of ADC circuit 200 in their previous states). For purposes of the voltage comparison at this time, $$Vx = V_{IN} - \left(\frac{Vdd}{2} \times \frac{8}{32}\right).$$

The fraction $$\frac{8}{32}$$

is used here because capacitor 216 has been connected to reference switch S8. The comparison and switching techniques are repeated in this manner to generate the individual bits that correspond to the digital representation of the original analog input voltage ($V_{IN}$).

Figure 9:
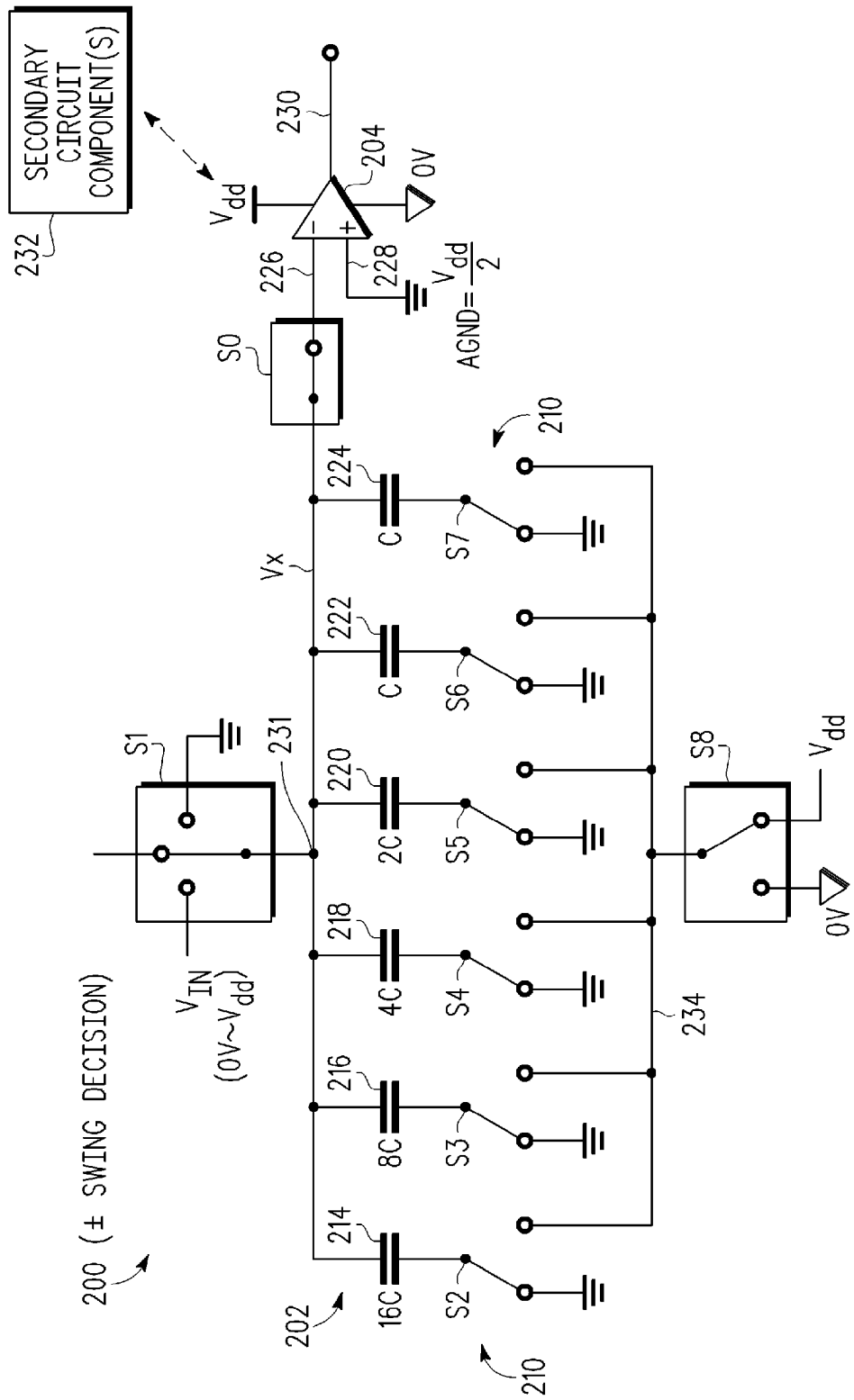
FIG. 9 is a circuit diagram of the ADC circuit, arranged in accordance with a plus/minus swing decision mode.

Referring back to query task 308, process 300 employs a similar approach when the polarity and MSB bits are "0" (task 322). In this regard, the following portion of this description assumes that query task 308 determines that Vx≦AGND, and that task 322 is performed (rather than task 310). For those conditions, the polarity bit is "0" and ADC circuit 200 will be rearranged in accordance with an appropriate plus/minus swing decision, as shown in FIG. 9. To achieve the topology depicted in FIG. 9, ADC circuit 200 is rearranged by changing the state of reference switch S8, while maintaining the other switches in ADC circuit 200 in their previous states (refer to FIG. 5, which depicts the state of ADC circuit 200 prior to that shown in FIG. 9). More specifically, reference switch S8 is set such that its common terminal is connected to Vdd. This switching is necessary to prepare ADC circuit 200 for the decision associated with the next bit, i.e., the MSB-1 bit. Notably, reference switch S8 remains in this position until the LSB is decided.

Figure 10:
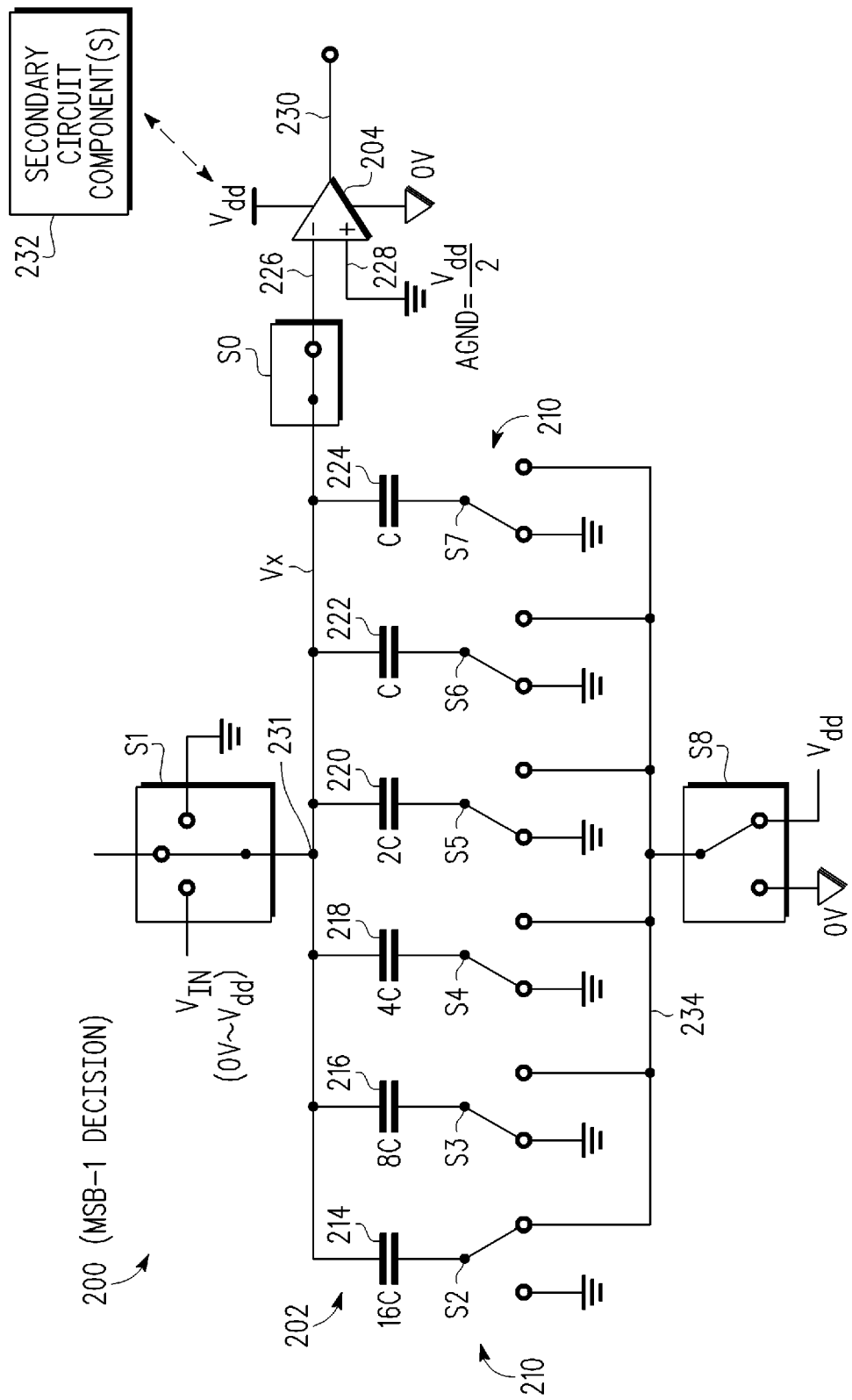
FIG. 10 is a circuit diagram of the ADC circuit, arranged in accordance with an MSB-1 decision mode.

Next, process 300 continues by performing the MSB-1 bit decision (task 324). In this regard, FIG. 10 is a circuit diagram of ADC circuit 200, arranged for operation in this MSB-1 decision mode. To achieve the MSB-1 decision topology depicted in FIG. 10, ADC circuit 200 is rearranged by changing the state of capacitor switch S2, while maintaining the other switches in ADC circuit 200 in their previous states. In particular, capacitor switch S2 is set such that its common terminal is coupled to the common terminal of reference switch S8. In other words, for the state depicted in FIG. 10, Vdd is applied to the common terminal of capacitor switch S2 (and, therefore, to the bottom conductor of capacitor 214). Notably, the switching of capacitor switch S2 results in a change in Vx (the voltage at inverting input node 226 is no longer equal to $V_{IN}$). In particular, the new value of Vx will be $$Vx = V_{IN} + \left(\frac{Vdd}{2} \times \frac{16}{32}\right).$$

The updated value of Vx represents the residual voltage that remains for analog-to-digital conversion.

While ADC circuit 200 is arranged as shown in FIG. 10, process 300 performs the MSB-1 decision by comparing the new value of Vx to AGND (query task 326). If Vx<AGND at this time, then operational amplifier 204 will generate a relatively high voltage (i.e., a logic high value) at output node 230, and this output corresponds to an MSB-1 bit of "0" (task 328). Conversely, if Vx>AGND at this time, then operational amplifier 204 will generate a relatively low voltage (i.e., a logic low value) at output node 230, and this output corresponds to an MSB-1 bit of "1" (task 330). The determined bit value for MSB-1 can be recorded, saved, or output in an appropriate manner.

Figure 11:
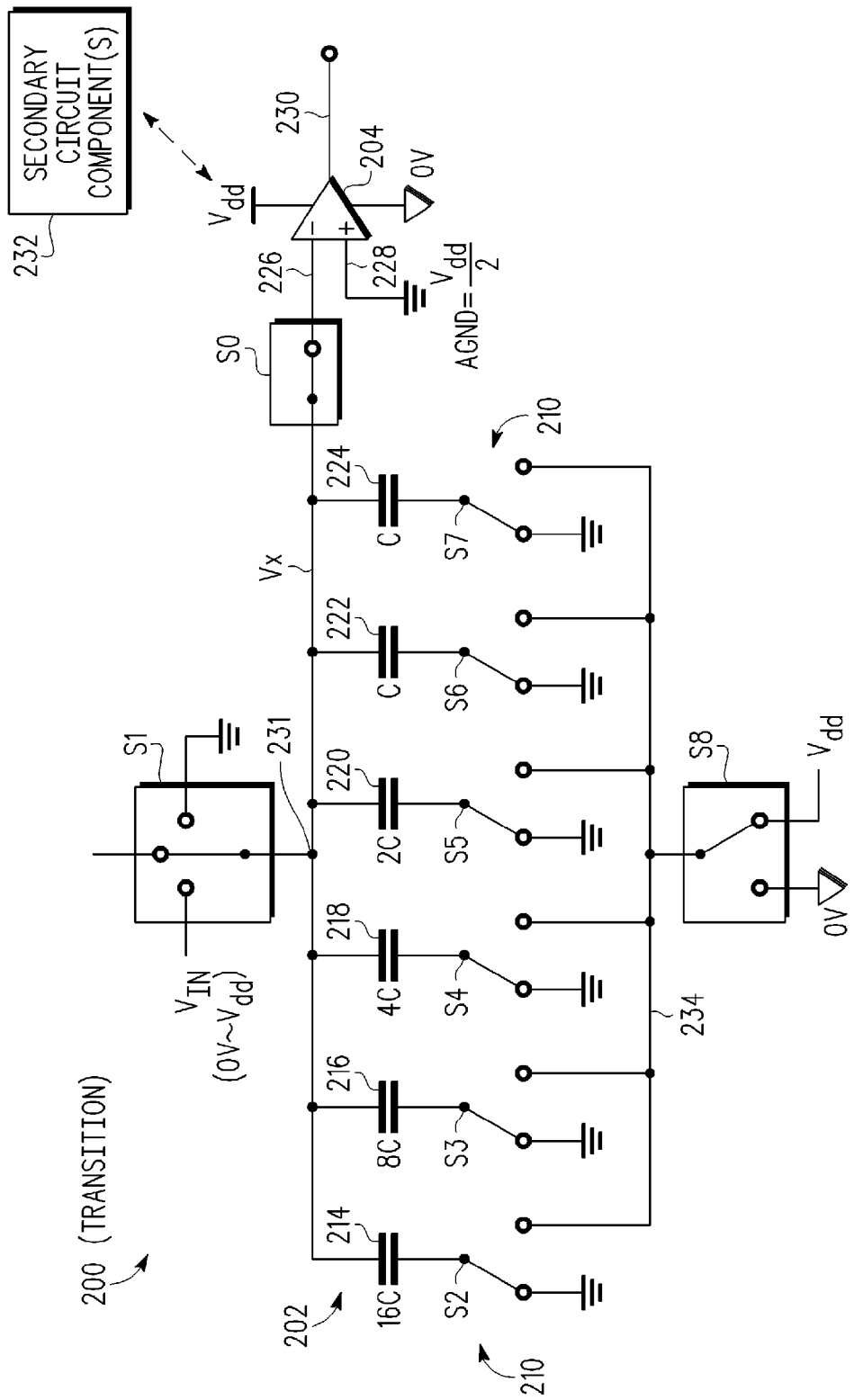
FIG. 11 is a circuit diagram of the ADC circuit, arranged in a transitional topology that follows a determination that the MSB-1 bit is a "0".

ADC circuit 200 preferably remains in the MSB-1 decision mode for a sufficient amount of time to accommodate the determination of the MSB-1 bit. The value of the MSB-1 bit influences the manner in which ADC circuit 200 is rearranged for subsequent operation. For example, if the MSB-1 bit is "0" at this time, then ADC circuit 200 is rearranged into the topology depicted in FIG. 11. The configuration shown in FIG. 11 is achieved by changing the state of capacitor switch S2 such that its common terminal is removed from the common terminal of reference switch S8 (i.e., removed from Vdd) and is instead connected to AGND, as indicated by task 330 in FIG. 3). The other switches of ADC circuit 200 are maintained in their previous states. If, however, the MSB-1 bit is "1" at this time, then ADC circuit 200 remains in the state depicted in FIG. 10. In other words, the common terminal of capacitor switch S2 remains connected to reference switch S8 and, therefore, capacitor 214 remains coupled between inverting input node 226 and Vdd (as indicated by task 328 in FIG. 3).

After completion of task 328 or task 330 (whatever the case may be), process 300 continues in a bit-by-bit manner until the LSB is decided (task 332). For example, the MSB-2 bit will be decided by changing capacitor switch S3 such that its common terminal is connected to the common terminal of reference switch S8 and, therefore, to Vdd (while leaving the other switches of ADC circuit 200 in their previous states). The comparison and switching techniques are repeated in this manner to generate the individual bits that correspond to the digital representation of the original analog input voltage ($V_{IN}$).

After the LSB has been determined (task 320 or task 332), process 300 may provide the digital output (task 334) in an appropriate manner for use by the host device. As mentioned previously, the digital representation of $V_{IN}$ will include a polarity bit and a number of bits that represent the magnitude of $V_{IN}$ in a digital form. The example shown and described here corresponds to an embodiment where the magnitude of $V_{IN}$ is expressed using five bits (excluding the polarity bit).

Consider an example where $V_{IN}$=2.0 volts, Vdd=3.0 volts, and $$AGND = \frac{Vdd}{2} = 1.5$$

volts. Here, the polarity and MSB decision mode will result in a polarity bit of "1" and an MSB of "1" because $V_{IN}$>1.5 volts. Thus, reference switch S8 will be connected to ground (zero volts) for the remainder of the ADC operation (see FIG. 6). For the MSB-1 decision (see FIG. 7), the new value of Vx will be 1.25 volts:

$$Vx = V_{IN} - \left(\frac{Vdd}{2} \times \frac{16}{32}\right) = 2.0 - (1.5 \times 0.5) = 1.25.$$

Consequently, the MSB-1 decision mode will result in an MSB-1 bit of "0" because at this time Vx<1.5 volts. Next, since the MSB-1 bit is "0", ADC circuit 200 transitions to the topology shown in FIG. 8, and thereafter connects capacitor switch S3 to reference switch S8 (i.e., to zero volts) for purposes of the MSB-2 decision. For the MSB-2 decision, the new value of Vx will be 1.625 volts:

$$Vx = V_{IN} - \left(\frac{Vdd}{2} \times \frac{8}{32}\right) = 2.0 - (1.5 \times 0.25) = 1.625.$$

Consequently, the MSB-2 decision mode will result in an MSB-2 bit of "1" because at this time Vx>1.5 volts. The remaining bits are determined in a similar manner by sequentially switching in the capacitors in capacitor bank 202 while performing successive voltage comparisons.

As another example, assume that $V_{IN}$=1.0 volt, Vdd=3.0 volts, and $$AGND = \frac{Vdd}{2} = 1.5$$

volts. Here, the polarity and MSB decision mode will result in a polarity bit of "0" and an MSB of "0" because $V_{IN}$<1.5 volts. Thus, reference switch S8 will be connected to Vdd (1.5 volts) for the remainder of the ADC operation (see FIG. 9). For the MSB-1 decision (see FIG. 10), the new value of Vx will be 1.75 volts:

$$Vx = V_{IN} + \left(\frac{Vdd}{2} \times \frac{16}{32}\right) = 1.0 + (1.5 \times 0.5) = 1.75.$$

Consequently, the MSB-1 decision mode will result in an MSB-1 bit of "1" because at this time Vx>1.5 volts. Next, since the MSB-1 bit is "1", ADC circuit 200 transitions to the topology shown in FIG. 11, and thereafter connects capacitor switch S3 to reference switch S8 (i.e., to 1.5 volts) for purposes of the MSB-2 decision. For the MSB-2 decision, the new value of Vx will be 1.375 volts:

$$Vx = V_{IN} + \left(\frac{Vdd}{2} \times \frac{8}{32}\right) = 1.0 + (1.5 \times 0.25) = 1.375.$$

Consequently, the MSB-2 decision mode will result in an MSB-2 bit of "0" because at this time Vx<1.5 volts. The remaining bits are determined in a similar manner by sequentially switching in the capacitors in capacitor bank 202 while performing successive voltage comparisons.

In summary, systems, devices, and methods configured in accordance with exemplary embodiments relate to:

An analog-to-digital converter comprising: a capacitor bank comprising a plurality of binary-weighted capacitors; an operational amplifier having an inverting input node, a noninverting input node coupled to an analog ground node, and an output node; a reset switch between the capacitor bank and the operational amplifier, the reset switch selectively coupling the capacitor bank to the inverting input node; and an input switch having its common terminal coupled to the capacitor bank, the input switch selectively coupling the capacitor bank to either an analog input voltage, a floating terminal, or the analog ground node. The analog-to-digital converter may further comprises secondary circuit components associated with the operational amplifier, wherein the secondary circuit components are coupled to the operational amplifier when the reset switch is in a first state that removes the operational amplifier from the capacitor bank. In one embodiment, the secondary circuit components are disconnected from the operational amplifier when the reset switch is in a second state that couples the operational amplifier to the capacitor bank. The analog-to-digital converter may further comprise a plurality of capacitor switches corresponding to the plurality of binary-weighted capacitors, wherein: each of the plurality of binary-weighted capacitors has a first conductor coupled to the common terminal of the input switch; each of the plurality of capacitor switches has a common terminal, a first selectable terminal coupled to the analog ground node, and a second selectable terminal; and each of the plurality of binary-weighted capacitors has a second conductor coupled to the common terminal of its corresponding capacitor switch. The analog-to-digital converter may further comprise a reference switch having a common terminal, a first selectable terminal coupled to a lower reference voltage, and a second selectable terminal coupled to an upper reference voltage, wherein the second selectable terminal of each of the plurality of capacitor switches is coupled to the common terminal of the reference switch. In some embodiments, the analog-to-digital converter generates an N-bit digital output and a polarity bit from the analog input voltage, and the capacitor bank consists of N binary-weighted capacitors and one balancing capacitor having a unit capacitance.

An analog-to-digital converter (ADC) circuit comprising: a comparator having a noninverting input node coupled to an analog ground node, an inverting input node, and an output node; a capacitor bank comprising a capacitor input node, a first capacitor having its first conductor coupled to the capacitor input node, and a second capacitor having its first conductor coupled to the capacitor input node, the first capacitor and the second capacitor being binary-weighted; a reset switch between the capacitor input node and the inverting input node, the reset switch selectively coupling the capacitor bank to the comparator; an input switch having its common terminal coupled to the capacitor input node, the input switch selectively coupling the capacitor input node to either an analog input voltage, a floating terminal, or the analog ground node; a first capacitor switch having its common terminal coupled to a second conductor of the first capacitor, the first capacitor switch selectively coupling the second conductor of the first capacitor to either the analog ground node or to a capacitor reference node; a second capacitor switch having its common terminal coupled to a second conductor of the second capacitor, the second capacitor switch selectively coupling the second conductor of the second capacitor to either the analog ground node or to the capacitor reference node; and a reference switch having its common terminal coupled to the capacitor reference node, the reference switch selectively coupling the capacitor reference node to either a lower reference voltage or an upper reference voltage. In one embodiment, the reset switch, the input switch, the first capacitor switch, and the second capacitor switch are set to place the ADC circuit into a reset topology such that: the reset switch is in an open state that disconnects the comparator from the capacitor input node; the common terminal of the input switch is coupled to the analog ground node; the common terminal of the first capacitor switch is coupled to the analog ground node; the common terminal of the second capacitor switch is coupled to the analog ground node; and the first capacitor and the second capacitor are reset. In certain embodiments, the reset switch, the input switch, the first capacitor switch, and the second capacitor switch are set to place the ADC circuit into a sample topology such that: the reset switch is in an open state that disconnects the comparator from the capacitor input node; the common terminal of the input switch is coupled to the analog input voltage; the common terminal of the first capacitor switch is coupled to the analog ground node; the common terminal of the second capacitor switch is coupled to the analog ground node; and the first capacitor and the second capacitor sample the analog input voltage. In some embodiments, the reset switch, the input switch, the first capacitor switch, and the second capacitor switch are set to place the ADC circuit into a polarity decision topology such that: the reset switch is in a closed state that couples the comparator to the capacitor input node; the common terminal of the input switch is coupled to the floating terminal; the common terminal of the first capacitor switch is coupled to the analog ground node; the common terminal of the second capacitor switch is coupled to the analog ground node; and the comparator compares the voltage at the capacitor input node to the analog ground node. In certain embodiments, if the voltage at the capacitor input node is greater than analog ground, the comparator generates a logic high polarity bit at its output node; and if the voltage at the capacitor input node is less than or equal to analog ground, the comparator generates a logic low polarity bit at its output node. In some embodiments, the comparator generates a logic high MSB at its output node if the voltage at the capacitor input node is greater than analog ground. In some embodiments, the reset switch, the input switch, the first capacitor switch, the second capacitor switch, and the reference switch are set to place the ADC circuit into a plus/minus swing decision topology such that: the reset switch is in a closed state that couples the comparator to the capacitor input node; the common terminal of the input switch is coupled to the floating terminal; the common terminal of the first capacitor switch is coupled to the analog ground node; the common terminal of the second capacitor switch is coupled to the analog ground node; and the common terminal of the reference switch is coupled to the lower reference voltage. In certain embodiments, the reset switch, the input switch, the first capacitor switch, the second capacitor switch, and the reference switch are set to place the ADC circuit into an MSB-1 decision topology such that: the reset switch is in a closed state that couples the comparator to the capacitor input node; the common terminal of the input switch is coupled to the floating terminal; the common terminal of the first capacitor switch is coupled to the capacitor reference node; the common terminal of the second capacitor switch is coupled to the analog ground node; the common terminal of the reference switch is coupled to the lower reference voltage; and the comparator compares the voltage at the capacitor input node to analog ground. In some embodiments, the comparator generates a logic low MSB at its output node if the voltage at the capacitor input node is less than or equal to analog ground. In some embodiments, the reset switch, the input switch, the first capacitor switch, the second capacitor switch, and the reference switch are set to place the ADC circuit into a plus/minus swing decision topology such that: the reset switch is in a closed state that couples the comparator to the capacitor input node; the common terminal of the input switch is coupled to the floating terminal; the common terminal of the first capacitor switch is coupled to the analog ground node; the common terminal of the second capacitor switch is coupled to the analog ground node; and the common terminal of the reference switch is coupled to the upper reference voltage. In certain embodiments, the reset switch, the input switch, the first capacitor switch, the second capacitor switch, and the reference switch are set to place the ADC circuit into an MSB-1 decision topology such that: the reset switch is in a closed state that couples the comparator to the capacitor input node; the common terminal of the input switch is coupled to the floating terminal; the common terminal of the first capacitor switch is coupled to the capacitor reference node; the common terminal of the second capacitor switch is coupled to the analog ground node; the common terminal of the reference switch is coupled to the upper reference voltage; and the comparator compares the voltage at the capacitor input node to analog ground.

A method of converting an analog input voltage into a digital representation using a plurality of binary-weighted capacitors and an operational amplifier, wherein the plurality of binary-weighted capacitors are coupled together at a capacitor input node, and wherein the method involves: resetting the plurality of binary-weighted capacitors by isolating the operational amplifier from the plurality of binary-weighted capacitors, and by applying analog ground across the plurality of binary-weighted capacitors; sampling the analog input voltage by applying the analog input voltage to the capacitor input node, with the operational amplifier isolated; performing a polarity/MSB decision for the analog input voltage by coupling the operational amplifier to the capacitor input node, and by comparing the voltage present at the capacitor input node to analog ground; and in response to the polarity/MSB decision, recording a polarity bit and an MSB. The method may further comprise: coupling at least one secondary circuit component to the operational amplifier after the operational amplifier is isolated from the plurality of binary-weighted capacitors; and operating the at least one secondary circuit component in conjunction with the operational amplifier while the operational amplifier is isolated from the plurality of binary-weighted capacitors. The method of may further comprise disconnecting the at least one secondary circuit component from the operational amplifier before coupling the operational amplifier to the plurality of binary-weighted capacitors.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An analog-to-digital converter comprising:
   a capacitor bank comprising a plurality of binary-weighted capacitors;
   an operational amplifier having an inverting input node, a noninverting input node coupled to an analog ground node, and an output node;
   a reset switch between the capacitor bank and the operational amplifier, the reset switch selectively coupling the capacitor bank to the inverting input node; and
   an input switch having its common terminal coupled to the capacitor bank, the input switch selectively coupling the capacitor bank to either an analog input voltage, a floating terminal, or the analog ground node.

2. The analog-to-digital converter of claim 1, further comprising secondary circuit components associated with the operational amplifier, wherein the secondary circuit components are coupled to the operational amplifier when the reset switch is in a first state that removes the operational amplifier from the capacitor bank.

3. The analog-to-digital converter of claim 2, wherein the secondary circuit components are disconnected from the operational amplifier when the reset switch is in a second state that couples the operational amplifier to the capacitor bank.

4. The analog-to-digital converter of claim 1, further comprising a plurality of capacitor switches corresponding to the plurality of binary-weighted capacitors, wherein:
   each of the plurality of binary-weighted capacitors has a first conductor coupled to the common terminal of the input switch;
   each of the plurality of capacitor switches has a common terminal, a first selectable terminal coupled to the analog ground node, and a second selectable terminal; and
   each of the plurality of binary-weighted capacitors has a second conductor coupled to the common terminal of its corresponding capacitor switch.

5. The analog-to-digital converter of claim 4, further comprising a reference switch having a common terminal, a first selectable terminal coupled to a lower reference voltage, and a second selectable terminal coupled to an upper reference voltage, wherein the second selectable terminal of each of the plurality of capacitor switches is coupled to the common terminal of the reference switch.

6. The analog-to-digital converter of claim 1, wherein:
   the analog-to-digital converter generates an N-bit digital output and a polarity bit from the analog input voltage; and
   the capacitor bank consists of N binary-weighted capacitors and one balancing capacitor having a unit capacitance.

7. An analog-to-digital converter (ADC) circuit comprising:
   a comparator having a noninverting input node coupled to an analog ground node, an inverting input node, and an output node;
   a capacitor bank comprising a capacitor input node, a first capacitor having its first conductor coupled to the capacitor input node, and a second capacitor having its first conductor coupled to the capacitor input node, the first capacitor and the second capacitor being binary-weighted;
   a reset switch between the capacitor input node and the inverting input node, the reset switch selectively coupling the capacitor bank to the comparator;
   an input switch having its common terminal coupled to the capacitor input node, the input switch selectively coupling the capacitor input node to either an analog input voltage, a floating terminal, or the analog ground node;
   a first capacitor switch having its common terminal coupled to a second conductor of the first capacitor, the first capacitor switch selectively coupling the second conductor of the first capacitor to either the analog ground node or to a capacitor reference node;
   a second capacitor switch having its common terminal coupled to a second conductor of the second capacitor, the second capacitor switch selectively coupling the second conductor of the second capacitor to either the analog ground node or to the capacitor reference node; and
   a reference switch having its common terminal coupled to the capacitor reference node, the reference switch selectively coupling the capacitor reference node to either a lower reference voltage or an upper reference voltage.

8. The ADC circuit of claim 7, wherein the reset switch, the input switch, the first capacitor switch, and the second capacitor switch are set to place the ADC circuit into a reset topology such that:
   the reset switch is in an open state that disconnects the comparator from the capacitor input node;
   the common terminal of the input switch is coupled to the analog ground node;
   the common terminal of the first capacitor switch is coupled to the analog ground node;
   the common terminal of the second capacitor switch is coupled to the analog ground node; and
   the first capacitor and the second capacitor are reset.

9. The ADC circuit of claim 8, wherein the reset switch, the input switch, the first capacitor switch, and the second capacitor switch are set to place the ADC circuit into a sample topology such that:
   the reset switch is in an open state that disconnects the comparator from the capacitor input node;
   the common terminal of the input switch is coupled to the analog input voltage;
   the common terminal of the first capacitor switch is coupled to the analog ground node;
   the common terminal of the second capacitor switch is coupled to the analog ground node; and
   the first capacitor and the second capacitor sample the analog input voltage.

10. The ADC circuit of claim 9, wherein the reset switch, the input switch, the first capacitor switch, and the second capacitor switch are set to place the ADC circuit into a polarity decision topology such that:
   the reset switch is in a closed state that couples the comparator to the capacitor input node;
   the common terminal of the input switch is coupled to the floating terminal;

the common terminal of the first capacitor switch is coupled to the analog ground node;

the common terminal of the second capacitor switch is coupled to the analog ground node; and the comparator compares the voltage at the capacitor input node to the analog ground node.

11. The ADC circuit of claim 10, wherein:

if the voltage at the capacitor input node is greater than analog ground, the comparator generates a logic high polarity bit at its output node; and if the voltage at the capacitor input node is less than or equal to analog ground, the comparator generates a logic low polarity bit at its output node.

12. The ADC circuit of claim 10, wherein the comparator generates a logic high MSB at its output node if the voltage at the capacitor input node is greater than analog ground.

13. The ADC circuit of claim 12, wherein the reset switch, the input switch, the first capacitor switch, the second capacitor switch, and the reference switch are set to place the ADC circuit into a plus/minus swing decision topology such that:

the reset switch is in a closed state that couples the comparator to the capacitor input node;

the common terminal of the input switch is coupled to the floating terminal;

the common terminal of the first capacitor switch is coupled to the analog ground node;

the common terminal of the second capacitor switch is coupled to the analog ground node; and the common terminal of the reference switch is coupled to the lower reference voltage.

14. The ADC circuit of claim 13, wherein the reset switch, the input switch, the first capacitor switch, the second capacitor switch, and the reference switch are set to place the ADC circuit into an MSB-1 decision topology such that:

the reset switch is in a closed state that couples the comparator to the capacitor input node;

the common terminal of the input switch is coupled to the floating terminal;

the common terminal of the first capacitor switch is coupled to the capacitor reference node;

the common terminal of the second capacitor switch is coupled to the analog ground node;

the common terminal of the reference switch is coupled to the lower reference voltage; and the comparator compares the voltage at the capacitor input node to analog ground.

15. The ADC circuit of claim 10, wherein the comparator generates a logic low MSB at its output node if the voltage at the capacitor input node is less than or equal to analog ground.

16. The ADC circuit of claim 15, wherein the reset switch, the input switch, the first capacitor switch, the second capacitor switch, and the reference switch are set to place the ADC circuit into a plus/minus swing decision topology such that:

the reset switch is in a closed state that couples the comparator to the capacitor input node;

the common terminal of the input switch is coupled to the floating terminal;

the common terminal of the first capacitor switch is coupled to the analog ground node;

the common terminal of the second capacitor switch is coupled to the analog ground node; and the common terminal of the reference switch is coupled to the upper reference voltage.

17. The ADC circuit of claim 16, wherein the reset switch, the input switch, the first capacitor switch, the second capacitor switch, and the reference switch are set to place the ADC circuit into an MSB-1 decision topology such that:

the reset switch is in a closed state that couples the comparator to the capacitor input node;

the common terminal of the input switch is coupled to the floating terminal;

the common terminal of the first capacitor switch is coupled to the capacitor reference node;

the common terminal of the second capacitor switch is coupled to the analog ground node;

the common terminal of the reference switch is coupled to the upper reference voltage; and the comparator compares the voltage at the capacitor input node to analog ground.

18. A method of converting an analog input voltage into a digital representation using a plurality of binary-weighted capacitors and an operational amplifier, wherein the plurality of binary-weighted capacitors are coupled together at a capacitor input node, the method comprising:

resetting the plurality of binary-weighted capacitors by isolating the operational amplifier from the plurality of binary-weighted capacitors, and by applying analog ground across the plurality of binary-weighted capacitors;

sampling the analog input voltage by applying the analog input voltage to the capacitor input node, with the operational amplifier isolated;

performing a polarity/MSB decision for the analog input voltage by coupling the operational amplifier to the capacitor input node, and by comparing the voltage present at the capacitor input node to analog ground; and in response to the polarity/MSB decision, recording a polarity bit and an MSB.

19. The method of claim 18, further comprising:

coupling at least one secondary circuit component to the operational amplifier after the operational amplifier is isolated from the plurality of binary-weighted capacitors; and operating the at least one secondary circuit component in conjunction with the operational amplifier while the operational amplifier is isolated from the plurality of binary-weighted capacitors.

20. The method of claim 19, further comprising disconnecting the at least one secondary circuit component from the operational amplifier before coupling the operational amplifier to the plurality of binary-weighted capacitors.

* * * * *